United States Patent [19]

Bryce

[11] Patent Number: 5,068,519

[45] Date of Patent: Nov. 26, 1991

[54] MAGNETIC DOCUMENT VALIDATOR EMPLOYING REMANENCE AND SATURATION MEASUREMENTS

[75] Inventor: David R. Bryce, Morrisville, Pa.

[73] Assignee: Brandt, Inc., Bensalem, Pa.

[21] Appl. No.: 463,316

[22] Filed: Jan. 10, 1990

[51] Int. Cl.⁵ .................. G06K 7/08; G01N 27/72; G01R 33/12

[52] U.S. Cl. .................. 235/449; 235/450; 324/228

[58] Field of Search .......... 235/449, 450; 324/228; 209/534; 194/206, 213, 320

[56] References Cited

U.S. PATENT DOCUMENTS

| | | | |
|---|---|---|---|
| 3,599,153 | 8/1971 | Lewis et al. | 235/449 |
| 3,796,859 | 3/1974 | Thompson | 360/113 |
| 4,038,596 | 7/1977 | Lee | 235/449 |
| 4,617,458 | 10/1986 | Bryce | 235/449 |
| 4,764,725 | 8/1988 | Bryce | 235/449 |

Primary Examiner—Stuart S. Levy
Assistant Examiner—Edward H. Sikorski
Attorney, Agent, or Firm—Shenier & O'Connor

[57] ABSTRACT

A method of and apparatus for determining the genuineness of a document such as a currency note printed at least in part with magnetizable ink in which there is produced a first signal as a measure of the saturation magnetization of a portion of the document printed with the ink and a second signal as a measure of the remanent magnetization of said portion and in which the ratio of the second signal to the first signal is determined as a measure of genuineness of the document.

23 Claims, 5 Drawing Sheets

MAGNETIC DOCUMENT VALIDATOR EMPLOYING REMANENCE AND SATURATION MEASUREMENTS

BACKGROUND OF THE INVENTION

This invention relates to a method and apparatus for magnetically determining the genuineness of documents such as United States currency printed in part at least with magnetizable ink.

Currency validators commonly exploit the fact that certain portions of the currency being validated are printed with magnetic (i.e., magnetizable) ink. Such validators are shown, for example, in U.S. Pat. Nos. 4,114,804, 4,593,184 and 4,764,725, owned by the assignee herein. Generally, such validators operate by measuring magnetization of ink that is being simultaneously magnetized (the "saturation magnetization") or by measuring the magnetization of ink that has emerged from a magnetizing field (the "remanent magnetization"). The magnetization measured by one of these techniques is typically compared with one or more thresholds to provide an indication of the genuineness of the currency being examined. Both of these techniques, however, rely on the absolute level of measured magnetization, which may vary because of such factors as drive speed, spacing between the head and the note, condition of the note, and other factors unrelated to the genuineness of the note in question.

SUMMARY OF THE INVENTION

One of the objects of my invention is to provide a validator that validates documents containing magnetizable ink.

Another object of my invention is to provide an improved magnetic document validator which more closely measures the type of magnetic ink on the document than do validators of the prior art.

A further object of my invention is to provide a magnetic validator which is more accurate than are validators of the prior art.

A still further object of my invention is to provide a document validator which is insensitive to factors unrelated to the genuineness of the note being examined.

A further object of my invention is to provide a document validator which is simple and inexpensive.

Other and further objects will be apparent from the following description.

In general, my invention contemplates a document validator in which the remanent magnetization of a portion of the document is measured following the magnetization thereof and compared with the measured saturation magnetization of the same portion to provide an indication of the genuineness of the document. The magnetization measurements are preferably obtained by effecting relative movement between the document being scanned and two closely adjacent magnetic pole pieces, one of which is supplied with a current sufficient to saturate the ink on the document. The other pole piece is used to measure the remanent magnetization, or magnetic remanence, of a document portion that has been previously magnetized to saturation, either by passing a permanent magnet or by passing the first pole piece which is supplied with a saturating current. The outputs of the two pole pieces are preferably coupled to full-wave rectifiers, the outputs of which are integrated to provide respective saturation and remanence signals.

Preferably, the indication of genuineness is generated as a function of the ratio of the remanence signal to the saturation signal; in particular, a signal indicating a suspect document is generated if the ratio exceeds a predetermined value. This ratiometric comparison is preferably effected by amplifying the remanence signal relative to the saturation signal and supplying the two signals to the inputs of a differential comparator.

Since my validator responds to the ratio of two magnetic measurements rather than to their absolute values alone, it is relatively insensitive to extraneous factors, such as those mentioned above, which affect the saturation and remanence measurements individually, but leave their ratio relatively unaffected. Moreover, it has been found that the ratio of remanent magnetization to saturation magnetization is highly characteristic of the ink being examined. Thus, my validator effectively screens out suspect documents which may otherwise escape detection.

BRIEF DESCRIPTION OF THE DRAWINGS

In the accompanying drawings to which reference is made in the instant specification and which are to be read in conjunction therewith and in which like reference numerals are used to indicate like parts in the various views.

DESCRIPTION OF THE PREFERRED EMBODIMENT

Figure 1:
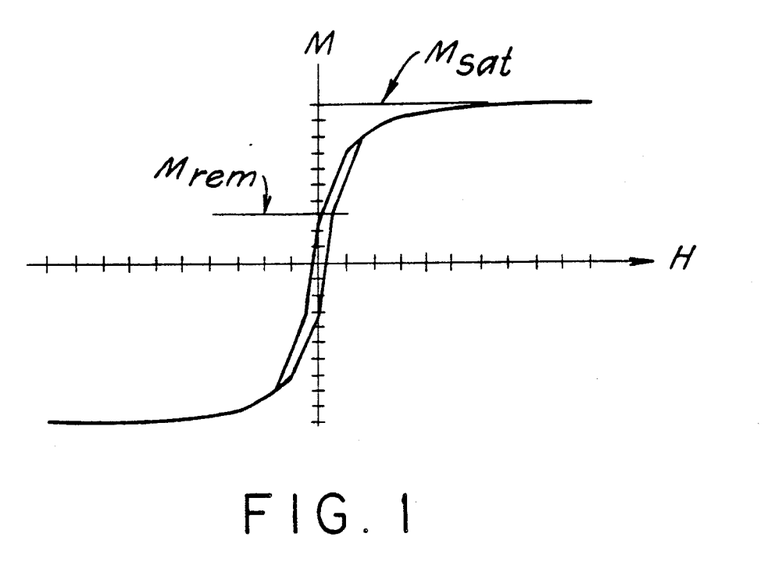
FIG. 1 is a plot of the magnetization curve of the ink of a counterfeit bill.

FIG. 1 is a plot of the magnetization (M) of the ink of a counterfeit bill versus the magnetizing force (H). As will be seen from FIG. 1, as H increases, M approaches a saturation limit ($M_{sat}$). However, owing to the hysteresis commonly present in magnetic materials, as H is reduced to zero, M does not vanish, but assumes a nonzero value ($M_{rem}$) commonly known as the magnetic remanence or remanent magnetization. As is evident from FIG. 1, the same effects also occur as H is brought to a large negative value and then reduced to zero.

Figure 2:
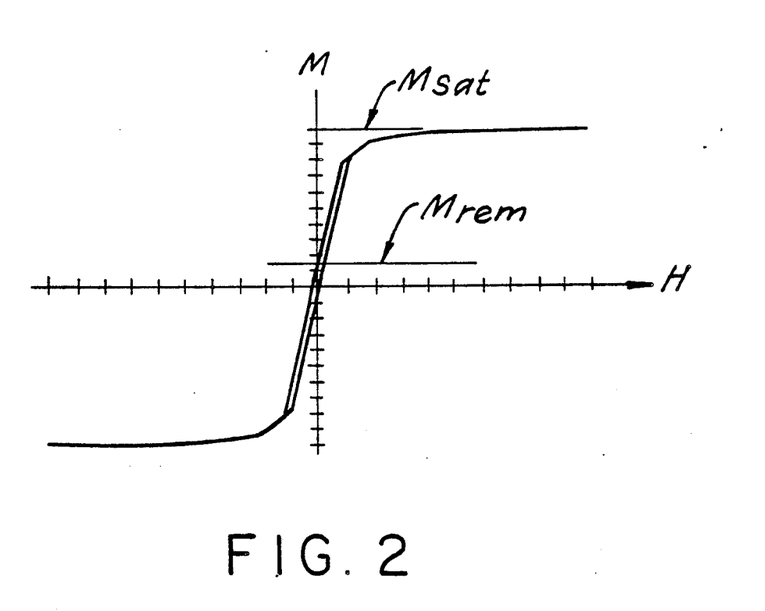
FIG. 2 is a plot of the magnetization curve of the ink of a genuine bill.

FIG. 2 shows a similar plot of M versus H on the same scale, but for a genuine bill. From a comparison of FIGS. 1 and 2, it will be seen that the values of $M_{sat}$ are substantially the same. However, in the case of the genuine bill of FIG. 2, $M_{rem}$ is appreciably smaller than the corresponding figure for the counterfeit bill of FIG. 1, as is the ratio $M_{rem}/M_{sat}$.

If one were to use a magnetic head to measure either $M_{sat}$ or $M_{rem}$ of a bill printed with magnetizable ink, the resulting signal would depend not only on $M_{rem}$ or $M_{sat}$, but also on such extraneous factors as the thickness of the ink layer, the speed at which the bill is advanced past the magnetic head, and other factors unrelated to the genuineness of the bill. Since, however, these extaneous factors all affect both the saturation measurement and the remanence measurement in substantially equal proportion, they leave the ratio $M_{rem}/M_{sat}$ substantially unchanged.

Figure 3:
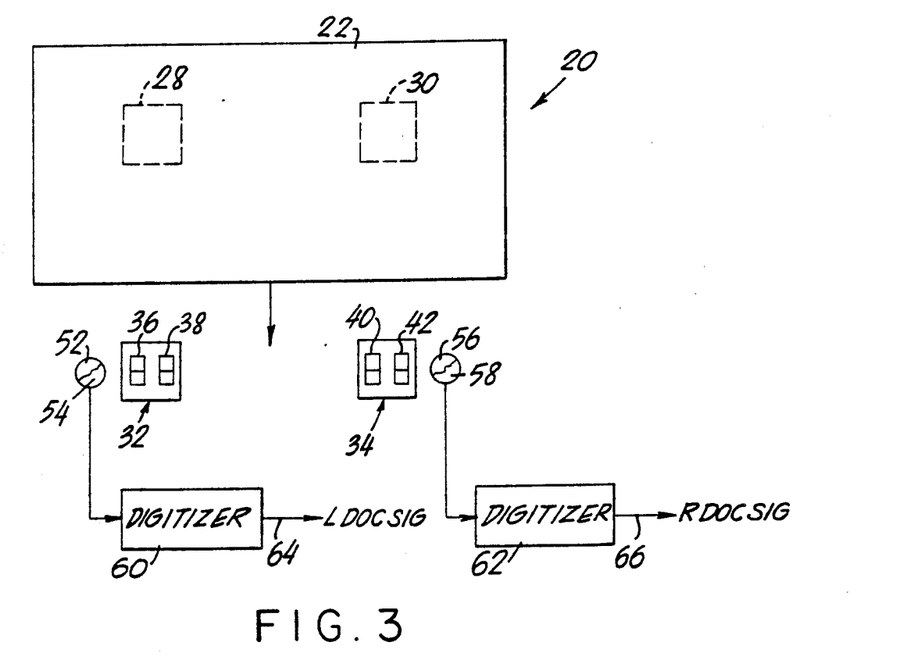
FIG. 3 is a partly schematic front elevation of a sheet feeder incorporating my validator, with parts broken away and with other parts omitted.
Figure 4:
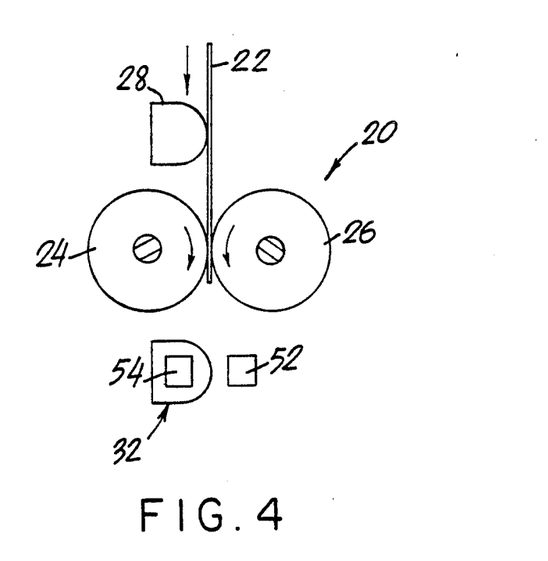
FIG. 4 is a left side elevation of the feeder shown in FIG. 3.
Figure 6:
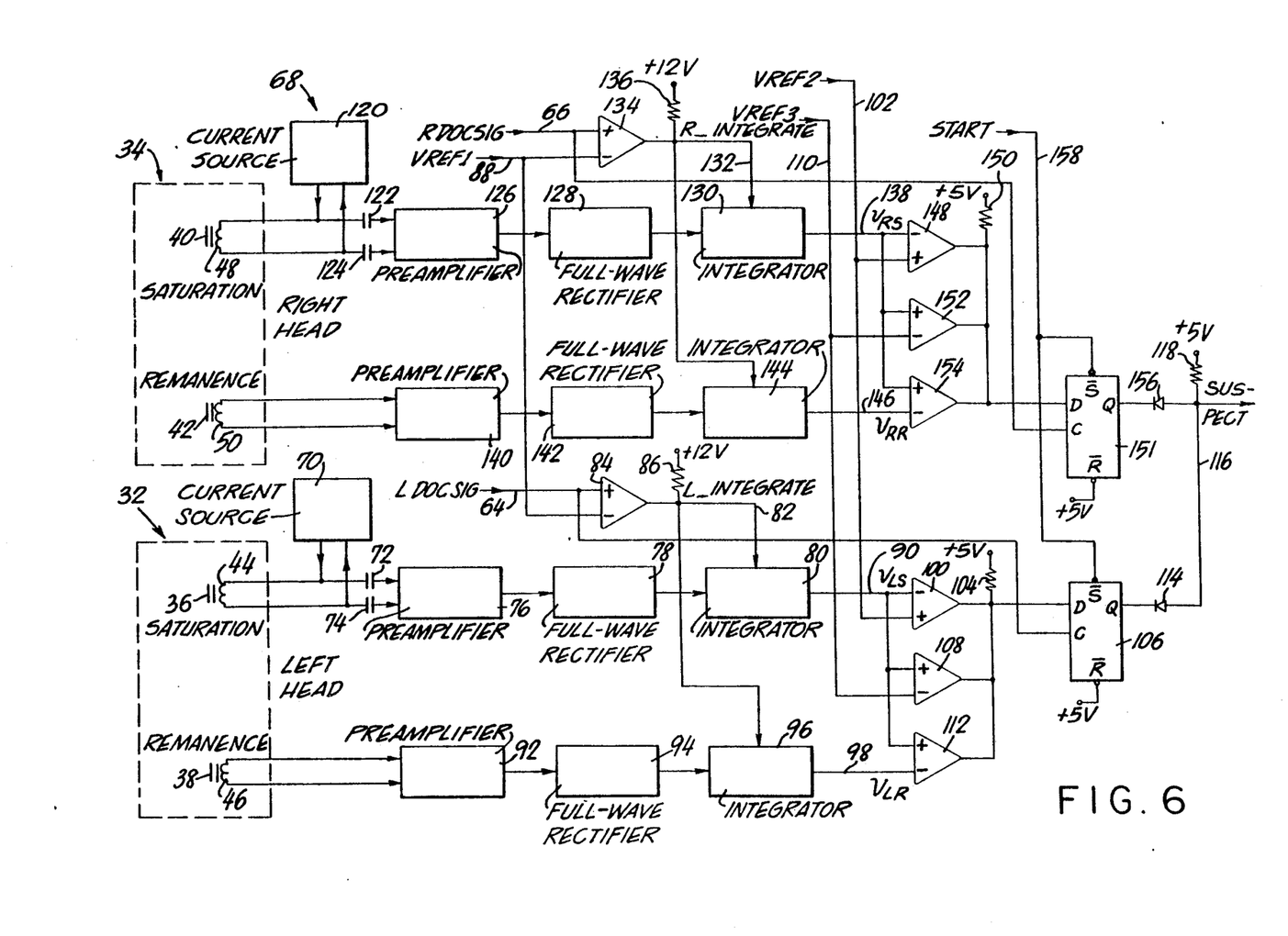
FIG. 6 is a schematic diagram of the signal-processing circuit of the validator of the feeder shown in FIG. 3.

FIG. 3 and 4 show the transport path of a feeder incorporating my magnetic document validator. In the feeder, indicated generally by the reference numeral 20, a document 22 is advanced, preferably widthwise as shown in FIG. 3, along a downward feed path by a pair of opposing feed rollers 24 and 26. As the document 22 advances along the feed path, it passes a pair of transversely spaced permanent magnets 28 and 30, which magnetize the inked portions of the document 22 passing thereby. As the document 22 advances further along the feed path, it passes a pair of dual-channel magnetic heads 32 and 34 disposed at transversely spaced locations on the feed path. Heads 32 and 34 are so arranged relative to magnets 28 and 30 on the same side of the feed path that the document portion passing magnet 28 passes head 32, while the document portion passing 30 passes head 34. Head 32 comprises a pair of transversely spaced magnetic cores 36 and 38, while head 34 comprises transversely spaced magnetic cores 40 and 42. Referring now also to FIG. 6, magnetic cores 36 to 42, which are shown in more detail in U.S. Pat. No. 4,764,725, carry respective coils 44, 46, 48 and 50 providing outputs to the circuit shown in FIG. 6.

A light source 52 disposed on the other side of the feed path from magnetic head 32 normally directs a beam onto a photodetector 54 disposed adjacent to head 32 on the same side of the path as the head. In a similar manner, a light source 56 disposed on the other side of the feed path from magnetic head 34 normally directs a beam of light onto a photodetector 58 disposed adjacent to magnetic head 34 on the same side of the path as the head. Photodetectors 54 and 58 provide respective input signals to digitizing circuits 60 and 62, which provide low-key signals on LDOCSIG line 64 and on RDOCSIG line 66, respectively. These signals are used to control timing in the signal-processing circuit shown in FIG. 6, in a manner to be described below.

Coils 44 and 48 of heads 32 and 34 are used to measure magnetic saturation, while coils 46 and 50 of heads 32 and 34 are used to measure magnetic remanence.

The essence of my invention is the determination of the ratio of $M_{rem}$ to $M_{sat}$ as a measure of the genuineness of a bill. Preferably I employ an amplify-and-compare method described hereinbelow as being a simple and inexpensive method. Alternatively a divider circuit could be used or the ratio could be determined as part of a software program.

Referring now to FIG. 6, the signal-processing portion of my validator, indicated generally by the reference numeral 68, includes four separate channels associated with coils 44 to 50, which are identical except for the differences to be noted below. In a first channel circuit 68, the left saturation channel, respective capacitors 72 and 74 couple the terminals of saturation coil 44 to the input terminals of a preamplifier 76. A current source 70 supplies coil 44 with a current sufficient to magnetize to saturation any ink in the portion of document 22 passing head 32. Coil 44 supplies preamplifier 76 with an output signal whose instantaneous value depends on the rate of change of the flux in the magnetic circuit encircled by coil 44. This flux variation in turn depends on the saturation magnetization $M_{sat}$ of the ink passing the head 32. Preamplifier 76 amplifies this signal and supplies it to a full-wave rectifier 78, the output of which is coupled to an integrator 80. Integrator 80 is enabled in response to a low-level L—INTEGRATE signal provided on line 82 by a comparator 84 having its noninverting input coupled to LDOCSIG line 64 and its inverting input coupled to a line 88 carrying a reference potential VREF1. Comparator 84 also has its output coupled to a +12 volt line through a resistor 86. Integrator 80 provides a left saturation signal VLS on line 90.

In a similar manner, in the left remanence channel, coil 46 drives a preamplifier 92, the output of which is coupled to an integrator 96 through a full-wave rectifier 94. Integrator 96 is controlled by the same L—INTEGRATE signal on line 82 used to control integrator 80, so that both circuits integrate during the period over which a document 22 is passing the left head 32. Integrator 96 provides a left remanence signal $V_{LR}$ on line 98. Full-wave rectifier 94 and integrator 96 of the left remanence channel are identical to rectifier 78 and integrator 80, respectively of the left saturation channel. Amplifier 92 is similar to amplifier 6, but is set to have a higher gain to compensate for the lower expected value of the remanence signal from coil 46. The remanence channel also differs from the saturation channel in that no current source is used to energize the magnetic coil 46, since it is merely being used to sense remanent magnetization.

I apply the left saturation signal $V_{LS}$ on line 90 to the inverting input of a comparator 100 and to the noninverting inputs of comparators 108 and 112. The noninverting input of comparator 100 and the inverting inputs of comparators 108 and 112 respectively receive a reference potential VREF2 on line 102, a reference potential VREF3 on line 110 and the left remanence signal $V_{LR}$ on line 98. I connect the outputs of comparators 100, 108 and 112 in common to a plus 5V terminal through a resistor 104 and to the D input of a D-type flip-flop 106. Flip-flop 106 has its Q output coupled to a SUSPECT line 116. A resistor 118 coupled to the 5 volt supply normally supplies line 116 with a high-level potential. Upon being reset, however, flip-flop 106 supplies line 116 with a low-level SUSPECT signal through diode 114, indicating a suspect document 22.

In a similar manner, in the right saturation channel of circuit 68, coil 48 of right head 34 drives a preamplifier 126, identical to preamplifier 76, through capacitors 122 and 124. A current source 120 identical to current source 70 supplies coil 48 with a current sufficient to magnetize to saturation any ink in the portion of document 22 passing head 34. Preamplifier 126 in turn drives a full-wave rectifier 128, identical to rectifiers 78 and 94, which drives an integrator 130 identical to integrators 80 and 96. Integrator 130 receives a low-level enable signal on a line 132 from a comparator 134, the output of which is also coupled to the +12 volt line through a resistor 136. Comparator 134 receives a noninverting input from RDOCSIG line 66 and an inverting input from VREF1 line 88. Integrator 130 provides a right saturation signal $V_{RS}$ on line 138.

In the right remanence channel, coil 50 of head 34 drives a preamplifier 140 identical to preamplifier 92. Amplifier 140 in turn drives a full-wave rectifier 142 identical to rectifiers 78, 94 and 128, while rectifier 142 drives an integrator 144 identical to the other integrators described above. Like integrator 130, integrator 144 receives an enabling R_INTEGRATE signal from line 132 coupled to comparator 134. Integrator 144 provides a right remanence signal $V_{RR}$ on line 146.

I apply the right saturating signal $V_{RS}$ on line 138 to the inverting terminal of a comparator 148 and to the respective noninverting terminals of comparators 152 and 154. The noninverting input of comparator 148 and the inverting inputs of comparators 152 and 154 respectively receive the reference potential VREF2 on line 102, the reference potential VREF3 on line 110 and the right remanence signal $V_{RR}$ on line 146. I connect the outputs of comparators 48, 152 and 154 in common to the plus 5V supply through a resistor 150 and to the D input of a D-type flip-flop 151. Flip-flop 151 has its Q output coupled to the cathode of a diode 156, the anode of which is coupled to SUSPECT line 116.

Since the operation of the right and left channels are similar, only that of the right channel will be described. Initially, flip-flop 151, like flip-flop 106, is set by a low level START signal on line 158. Integrators 130 and 144, which are initially disabled, are enabled in response to a low-level R_INTEGRATE signal which is generated on line 132 when the RDOCSIG signal on line 66 drops below the VREF1 potential on line 88. Hence, as document 22 moves past magnetic head 34, integrator 130 generates a steadily increasing saturation signal $v_{RS}$ on line 138, while integrator 134 generates a steadily increasing remanence signal $v_{RR}$ on line 146. These signals are supplied to comparators 148, 152 and 154.

When document 22 clears right head 34 and sensor 58, the positive-going level transition in the RDOCSIG signal on line 66 clocks the D input into flip-flop 151 and, shortly thereafter, causes comparator 134 to supply a signal on line 132 to integrators 130 and 144 to reset them for the next document. Flip-flop 151 will be reset by comparator 148 if $v_{RS}$ line 138 is more positive than VREF2 line 102, by comparator 152 if line 138 is more negative than VREF3 line 110, and by comparator 154 if line 138 is more negative than $v_{RR}$ line 146. If flip-flop 151 is reset upon the occurrence of any of these conditions following the movement of document 22 past head 34, flip-flop 152 supplies SUSPECT lines 116 with a low-level signal through line 156. This signal, like the one derived from left flip-flop 106, may be used for any appropriate operation, such as actuating a display, halting the feeding of documents 22 from a tray, or the like.

Figure 7:
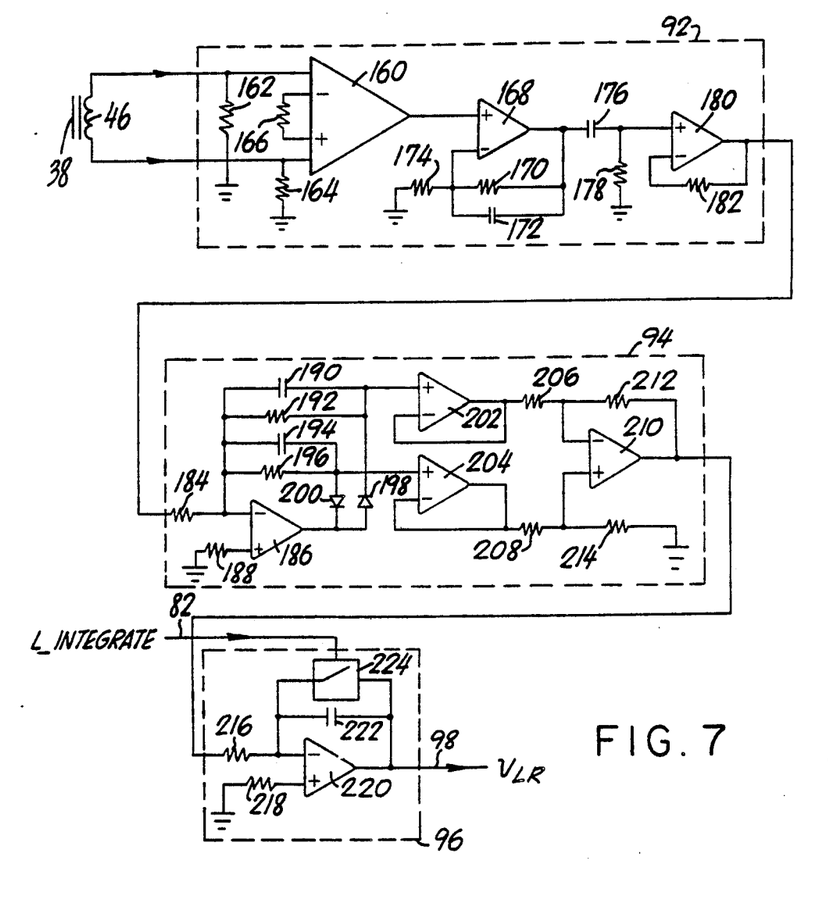
FIG. 7 is a schematic diagram showing in greater detail one channel of the circuit shown in FIG. 6.

FIG. 7 shows the internal construction of the preamplifier 92, full-wave rectifier 94 and integrator 96 associated with remanence coil 46 of the left magnetic head 32. As noted above, the remaining full-wave rectifiers and integrators are identical to rectifier 94 and integrator 96. Similarly, preamplifier 140 is identical to preamplifier 92, while preamplifiers 76 and 126 are identical to preamplifiers 92 and 140 except for the gain adjustment, as will be described below. In preamplifier portion 92, an adjustable-gain operational amplifier 160 has its input terminals coupled to coil 46 as well as to ground through respective resistors 162 and 164. A resistor 166 is coupled between the gain-adjustment terminals of amplifier 160. Amplifier 160 supplies its output to the noninverting input of a buffer amplifier 168, the inverting input of which is coupled to the output through a resistor 170 and capacitor 172 and to ground through a resistor 174. A capacitor 176 and resistor 178 couple the output of amplifier 168 to the noninverting input of a second buffer amplifier 180. A resistor 182 provides a negative feedback path between the output of amplifier 180 and its inverting input. The overall gain of preamplifier 92 is controlled by suitable selection of resistor 166, resistors 170 and 174, and capacitor 172. Preferably, these elements, together with the corresponding elements of amplifiers 76, 126 and 140, are so selected that preamplifiers 92 and 140 have a gain approximately three times of amplifier 76 and 126. This higher gain compensates for the lower level of the outputs from remanence coils 46 and 50, and permits what are in effect ratiometic comparisons using only differential comparators.

In rectifier portion 94, an amplifier 186 receives an inverting input from amplifier 180 through a resistor 184. A resistor 188 connects the noninverting input of amplifier 186 to ground. Amplifier 186 supplies its output to the cathode of a first diode 200, the anode of which is coupled to the inverting input of amplifier 186 through parallel-connected capacitor 194 and resistor 196. Amplifier 186 also drives the anode of a second diode 198, the cathode of which is coupled to the inverting input of amplifier 186 through parallel-connected capacitor 190 and resistor 192. I connect the cathode of diode 198 and the anode of diode 200 respectively to the noninverting inputs of amplifiers 202 and 204, the inverting inputs of each of which is connected to its output. Respective resistors 206 and 208 apply the outputs of amplifiers 202 and 204 to the inverting and noninverting inputs, respectively, of an amplifier 210. Respective resistors 212 and 214 connect the inverting input of amplifier 210 to its output and the noninverting input of amplifier 210 to ground.

In operation, whenever the input to amplifier 186 is positive, the output of the amplifier goes negative and is coupled through diode 200 to capacitor 194 and resistor 196, as well as to the noninverting input of amplifier 204. During this same time period, however, the noninverting of amplifier 202 remains substantially at ground potential. As a result, amplifier 210, which provides an output proportional to the difference between the outputs of amplifiers 204 and 202, provides a negative output signal which is inverted relative to the input signal to amplifier 186. On the other hand, whenever the input to amplifier 186 becomes negative, diode 198 couples the positive output from amplifier 186 to the noninverting input of amplifier 202, while the noninverting input of amplifier 204 remains substantially at ground potential. As a result, amplifier 210 provides a negative output signal of the same polarity as the input to amplifier 186. Amplifier 210 thus provides a rectified output proportional to the absolute value of the input to amplifier 186.

Integrator portion 96 comprises an amplifier 220 having an inverting input which receives the output of amplifier 210 through a resistor 216 and a noninverting input connected to ground through a resistor 218. A capacitor 222 connected in parallel with an analog switch that closes whenever line 82 goes positive, couples the noninverting input of amplifier 220 to its output. Amplifier 220 provides an output on line 98 which is proportional to the integral of the input over the time interval that switch 224 remains open and which is inverted in polarity relative to the amplifier input. Since, as noted above, the input to amplifier 220 from amplifier 210 is always negative, the output $V_{LR}$ from amplifier 220 will always be positive.

Figure 8:
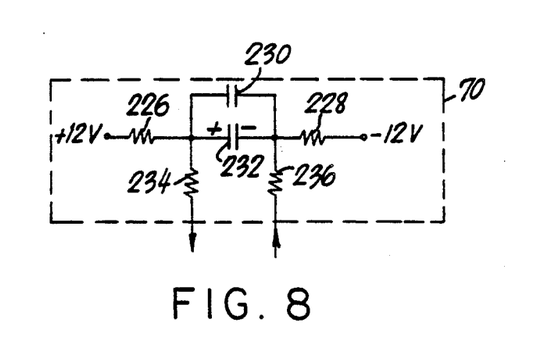
FIG. 8 is a schematic diagram showing the internal construction of one of the current sources shown in FIG. 6.

FIG. 8 is a schematic diagram of the internal structure of the current source 70, to which current source 120 is identical. In current source 70, respective resistors 226 and 228 couple the +12 volt line and the 12 volt line to the anode and cathode, respectively, of an electrolytic capacitor 232. A nonelectrolytic capacitor 230 connected in parallel with capacitor 232 provides a current path for high-frequency signals. Respective resistors 234 and 236 connect the terminals of capacitors 230 and 232 to the output terminals of the current source, which are coupled to saturation coil 44 as shown in FIG. 7. Resistors 226, 228, 234 and 236 are so selected as to a supply coil 44 with a current sufficient to magnetize to saturation any magnetic ink passing the head 32. In the particular embodiment shown, a current of 5.3 ma through coil 46 has been found to be sufficient.

Figure 9:
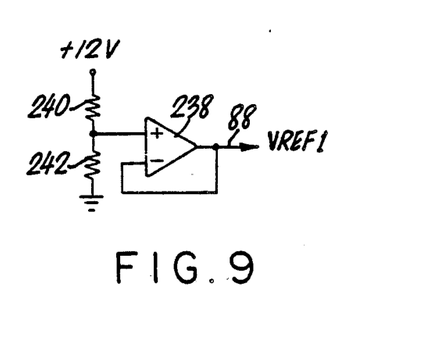
FIG. 9 is a schematic diagram of one of the reference voltage sources for the circuit shown in FIG. 6.

Referring now to FIG. 9, the VREF1 reference signal on line 88 is derived from the output of an amplifier 238, the inverting input of which is coupled to the output and the noninverting input is connected to the plus 12 volt supply through a resistor 240 and to ground through a resistor 242. Resistors 240 and 242 are so selected that the integrators that are controlled in response to the VREF1 signal are reset only after the outputs of the comparators to which they are coupled have been clocked into flip-flops 106 and 151. The VREF2 signal on line 102 and the VREF3 signal on line 110 are derived in a similar manner, the levels VREF2 and VREF3 being selected to provide the desired lower and upper thresholds for the integrated saturation signals $v_{LS}$ and $v_{RS}$.

Figure 10:
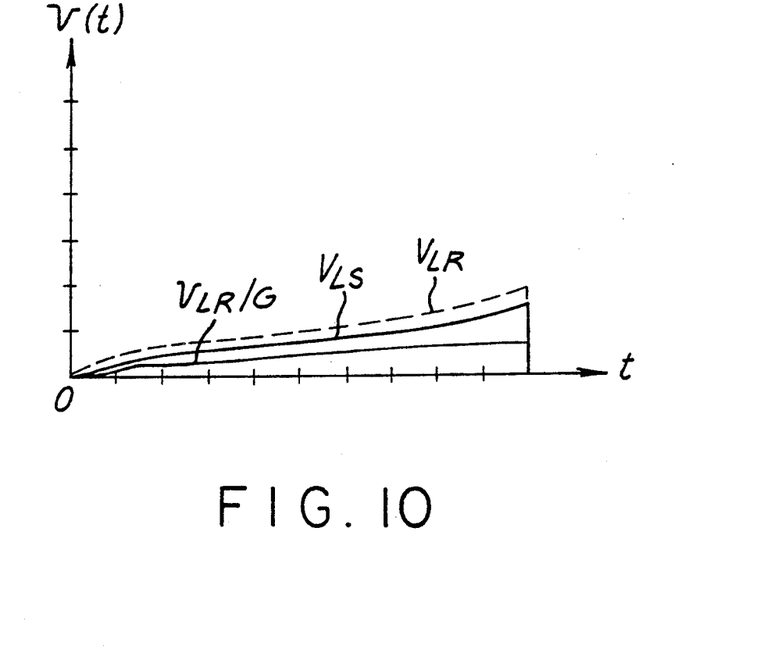
FIG. 10 is a plot of certain outputs of the circuit of FIG. 6 as a function of time for a counterfeit bill.

FIG. 10 shows the outputs of integrators 90 and 98 during the movement of a counterfeit document 22 past left magnetic head 32. As shown in the Figure, both outputs $v_{LS}$ and $v_{LR}$ start at zero and increase monotonically toward a maximum as document 22 clears the magnetic head 32, at which time the integrators 80 and 96 are reset. As noted above, the left remanence signal $v_{LR}$, like the right remanence signal $v_{RR}$, is amplified more than the corresponding saturation signal $v_{LS}$ to permit a ratiometric comparison using differential comparator 112. To provide an indication of the level that the remanence signal would have if amplified by only the same amount as the saturation signal, FIG. 10 also contains a plot $v_{LR}/G$, where G is the preferential gain factor of remanence preamplifier 92 relative to saturation preamplifier 76. Since, as can be seen by reference to FIG. 1, the ink in counterfeit document 22 has a relatively high ratio of $M_{rem}$ to $M_{sat}$, the remanence signal $v_{LR}$ will exceed the saturation signal $v_{LS}$ at the end of the sampling period. As a result, comparator 112 resets flip-flop 106 to generate a low-level SUSPECT signal on line 116.

Figure 11:
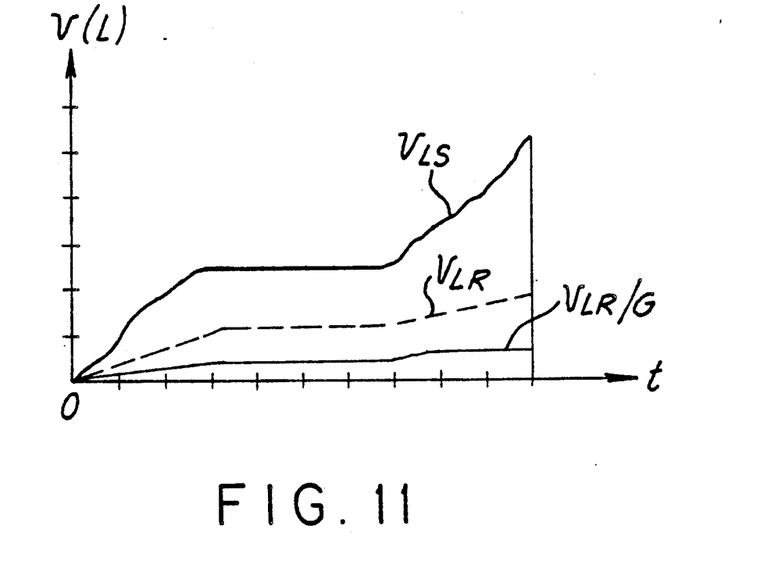
FIG. 11 is a plot of the same outputs of the circuit of FIG. 6 as a function of time for a genuine bill.

FIG. 11 shows a similar plot of the values $v_{LS}$, $v_{LR}$ and $v_{LR}/G$ as a function of time, but for a genuine document 22. Because of the low ratio of $M_{rem}$ to $M_{sat}$ characteristic of the ink in genuine document 22, as shown in FIG. 2, the remanence signal $v_{LR}$ will be less than the saturation signal $v_{LS}$, even though it has been preferentially amplified by the factor G. Accordingly, at the end of the integration period, the remanence signal $v_{LR}$ will not exceed the saturation signal $v_{LS}$, and flip-flop 106 will remain set. From the foregoing, it can be seen that the factor by which the initial remanence signal is amplified is such as will raise the remanence signal to a level above the saturation signal for a counterfeit bill while leaving the remanence signal above the saturation signal for a genuine bill.

Figure 5:
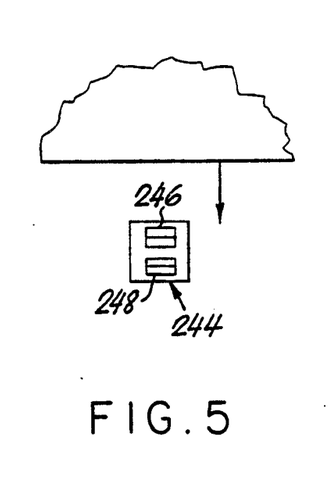
FIG. 5 is a fragmentary front elevation of an alternative embodiment in which a read-after-write head is used to avoid the necessity for a permanent magnet.

In the embodiment shown in FIGS. 3 and 4, permanent magnets 28 and 30 were used to magnetize to saturation the ink in document 22 as a preliminary to measuring the magnetic remanence. If desired, however, the permanent magnets may be eliminated, and a read-after-write head 244 used alternatively in place of each head 32 and 34. As shown in FIG. 5, read-after-write head 244 comprises a first magnetic core 246 followed by a second magnetic core 248 spaced downstream from core to 46. In operation, the coil (not shown) encircling core 246 is supplied with a current sufficient to magnetize to saturation any ink in the document portion passing thereby. The output of the coil drives saturation preamplifier 76 or 126 in the manner described above. As the magnetized portions of document 22 leave magnetic core 246, they pass magnetic core 248, the coil of which (not shown) provides a signal indicating the magnetic remanence of the document portion being scanned. This coil is coupled to remanence preamplifier 92 or 140 in the same manner as coil 46 or 50. Thus, by disposing the remanence core 248 downstream of the saturation core 246 in this manner, one can avoid the necessity for a separate permanent magnet.

It will be seen that I have accomplished the objects of my invention. My validator tests documents containing magnetizable ink, and is relatively insensitive to extraneous factors such as speed variations, the condition of the document, the spacing between the document and the magnetic head, and the like. My validator more closely measures the type of magnetic ink being used than do validators of the prior art and is therefore more accurate. Further, my validator is simple and inexpensive.

It will be understood that certain features and subcombinations are of utility and may be employed without reference to other features and combinations. This is contemplated by and within the scope of my claims. It is further obvious that various changes may be made in details within the scope of my claims without departing from the spirit of my invention. It is, therefore, to be understood that my invention is not to be limited to the specific details shown and described.

Having thus described my invention, what I claim is:

1. Apparatus for determining the genuineness of a document printed at least in part with magnetic ink including in combination
   means for applying to a portion of a document printed with magnetic ink a magnetizing force sufficient to saturate the magnetic ink in said portion,
   means for measuring the saturation magnetization of said portion while applying said saturating magnetic force to produce a first signal representing the saturation magnetization of said portion,
   means for measuring the magnetization of said portion after the removal of a magnetizing force from said portion to produce a second signal representing the remanent magnetization of said portion,
   and means for comparing said first and second signals with each other to provide an indication of the genuineness of said document.

2. Apparatus as in claim 1 in which said comparing means comprises means for determining the ratio of said signals.

3. Apparatus as in claim 1 including means responsive to said comparing means for producing a suspect signal when said second signal is greater than said first signal.

4. Apparatus as in claim 1 in which said comparing means comprises means for comparing said first signal with greater and smaller magnitude reference signals, said apparatus including means responsive to said comparing means for producing a suspect signal when said first signal is greater than said greater reference signal or less than said smaller reference signal.

5. Apparatus as in claim 1 in which said comparing means comprises means for comparing said first signal with greater and smaller magnitude reference signals, said apparatus including means responsive to said comparing means for producing a suspect signal whenever said first signal is greater than said greater reference signal or less than said smaller reference signal or said second signal is greater than said first signal.

6. Apparatus as in claim 1 in which said means for producing said second signal comprises means for amplifying an initial remanence signal by a predetermined factor to produce said second signal at a level above that of the first signal for a counterfeit document while leaving said second signal at a level below that of the first signal for a genuine document.

7. Apparatus for determining the genuineness of a document printed at least in part with magnetic ink including in combination,
means for applying to a portion of a document printed with magnetic ink a magnetizing force sufficient to saturate the magnetic ink in said portion,
means for measuring the saturation magnetization of said portion while applying said saturating magnetic force to produce a first signal representing the saturation magnetization of said portion,
means for measuring the magnetization of said portion after the removal of a magnetizing force from said portion to produce an initial signal representing the remanent magnetization of said portion,
means for amplifying said initial remanence signal by a predetermined factor to produce a second signal at a level above that of the first signal for a counterfeit document while leaving said signal at a level below that of the first signal for a genuine document,
means for comparing said first and second signals,
and means responsive to said comparing means for producing a suspect signal whenever said second signal is greater than said first signal.

8. Apparatus as in claim 7 including means for comparing said first signal with greater and smaller reference signals, said means responsive to said comparing means producing a suspect signal whenever said first signal is greater than said greater reference signal or smaller than said smaller reference signal.

9. Apparatus as in claim 7 in which each of said signal producing means comprises a magnetic head and means for effecting relative movement between said document and said head.

10. Apparatus as in claim 7 in which said first signal producing means comprises a magnetic head having a coil, means for effecting relative movement between said document and said head, means for supplying a current to said coil to magnetize said ink, and means for measuring the output voltage from said coil.

11. Apparatus as in claim 10 in which said head is a first head, said means for producing said initial remanent magnetization signal comprising a second magnetic head disposed adjacent to said first head.

12. Apparatus as in claim 11 in which said heads are transversely spaced from one another with reference to the direction of relative movement of said document and said heads.

13. Apparatus as in claim 11 in which said second head is disposed downstream from said first head with reference to the direction of relative movement of said document and said heads.

14. Apparatus as in claim 11 in which each of said signal producing means comprises means for scanning said document portion to produce an alternating current magnetization signal and means for rectifying said signal to a rectified signal.

15. Apparatus as in claim 14 including means for integrating said rectified signals.

16. Apparatus as in claim 15 including means for sensing the presence of said document at said magnetic head and means responsive to said sensing means for enabling said integrating means.

17. A method of determining the genuineness of a document printed at least in part with magnetizable ink including the steps of
applying to a portion of a document printed with magnetic ink a magnetizing force sufficient to saturate the magnetic ink in said portion,
measuring the saturation magnetization of said portion while applying said saturating magnetic force to obtain a saturization magnetization measurement,
measuring the magnetization of said portion after the removal of a magnetizing force from said portion to obtain a remanence magnetization measurement
and comparing said remanence magnetization measurement with said saturation magnetization measurement to provide an indication of the genuineness of said document.

18. A method as in claim 17 in which said comparing step comprises determining the ratio of said remanent magnetization measurement to said saturation magnetization measurement.

19. A method as in claim 17 in which said step of measuring said remanence magnetization comprises the steps of performing an initial remanence measurement and amplifying said initial remanence magnetization measurement by a predetermined factor to produce an amplified remanence magnetization measurement which is greater than said saturation magnetization measurement for a counterfeit document and smaller than said saturation magnetization measurement for a genuine document.

20. A method as in claim 19 in which said comparing step comprises determining the ratio of said amplified remanence magnetization measurement to said saturation remanence measurement.

21. A method as in claim 20 including the step of producing a suspect indication whenever said saturation magnetization measurement is less than a first reference value or greater than a second reference value or said remanence magnetization measurement is greater than said saturation magnetization measurement.

22. A method as in claim 19 in which each of said measuring steps comprises the steps of moving said document portion past a pickup head having a coil, measuring the output of said coil, rectifying said coil output and integrating said rectified output over a predetermined period of time over which said document moves past said head.

23. A method as in claim 22 in which said comparing step comprises comparing said integrated outputs and producing a suspect signal whenever said integrated remanence magnetization output exceeds said integrated saturation magnetization output.

* * * * *